United States Patent
Wu et al.

(10) Patent No.: US 6,774,684 B2
(45) Date of Patent: Aug. 10, 2004

(54) CIRCUITS AND METHODS FOR CONTROLLING TRANSIENTS DURING AUDIO DEVICE POWER-UP AND POWER-DOWN, AND SYSTEMS USING THE SAME

(75) Inventors: Xiaomin Wu, Austin, TX (US); Joseph Jason Welser, Austin, TX (US); Krishnan Subramaniam, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 652 days.

(21) Appl. No.: 09/764,200

(22) Filed: Jan. 17, 2001

(65) Prior Publication Data

US 2002/0094091 A1 Jul. 18, 2002

(51) Int. Cl.[7] .................................................. H03K 4/06
(52) U.S. Cl. ........................ 327/134; 327/131; 327/133
(58) Field of Search ............................. 327/18, 20, 26, 327/131, 133, 134

(56) References Cited

U.S. PATENT DOCUMENTS

| | | | |
|---|---|---|---|
| 6,492,928 B1 | * | 12/2002 | Rhode et al. ............... 341/144 |
| 6,522,278 B1 | * | 2/2003 | Rhode et al. ............... 341/144 |
| 6,542,024 B1 | * | 4/2003 | Somayajula ................ 327/535 |

FOREIGN PATENT DOCUMENTS

EP     0 757 437 A2    2/1997

OTHER PUBLICATIONS

Kumamoto Taichi; Audio Mute Circuit; Patent Abstracts of Japan from the European Patent Office; Application No. 07020072, filed on Feb. 8, 1995; Publication No. 08213849, Published on Aug. 20, 1996.

* cited by examiner

Primary Examiner—Tuan T. Lam
Assistant Examiner—Hiep Nguyen
(74) Attorney, Agent, or Firm—James J. Murphy; Thompson & Knight LLP

(57) ABSTRACT

Circuitry for ramping a voltage across a load 506 includes a charging circuit 500 for charging a capacitor 501 to generate a ramp-up wave form. Circuitry 511 selectively decouples a first driver 510 from load 506 during a ramping up mode and couples first driver 510 to load 506 during a normal operating mode. Ramp up driver 507a is selectively coupled to the load 506 during the ramp-up mode for ramping up the voltage across load 506 in response to the ramp-up wave form generated by charging circuitry 500. A discharge circuit 503d, 514a,b discharges capacitor 501 to generate a power-down wave form. Circuitry 511 selectively decouples a first driver 501 from output load 506 during the ramping down of the voltage across output load 506. A ramp-down driver 507b selectively ramps-down the voltage across output load 506 in response to the ramp-down wave form generated by discharge circuitry 503d, 514a,b.

13 Claims, 4 Drawing Sheets

CIRCUITS AND METHODS FOR CONTROLLING TRANSIENTS DURING AUDIO DEVICE POWER-UP AND POWER-DOWN, AND SYSTEMS USING THE SAME

BACKGROUND OF THE INVENTION

1. Field of the Invention

The present invention relates in general to electronic circuits and in particular to circuits and methods for controlling transients during audio device power-up and power-down, and systems using the same.

2. Description of the Related Art

Purchasers of state of the art home and portable audio systems expect improved audio performance, as well as more options for controlling playback from the given recording media. One of the most important performance criteria is the elimination of clicks, pops, noise and other artifacts audible to the user. Not only are these audible artifacts distracting to the listener, but they can also damage the system speakers or headset, This is especially true with transient artifacts, such as clicks and pops, which may spike the output signal driving the speakers or headset to a relatively high level.

In a typical audio system, the loads (e.g., the speakers or headset) are AC coupled to an audio integrated circuit sourcing electrical analog audio signals through a coupling capacitor. The normal quiescent output node voltage is roughly ½ of the power supply voltage. However, before power is supplied to the circuit, the output node voltage at the coupling capacitors is zero volts. Subsequently, when the circuit is powered-up, the output node voltage transitions from zero volts to the quiescent voltage, thereby charging the coupling capacitors. This voltage transition can generate an audible sound in the speakers or headset, typically called a "pop." A "pop" can also occur when the system powers down and when the output nodes transition from quiescent voltage to zero volts.

While there are presently a number of different of techniques for controlling pops, these techniques adversely impact other aspects of system performance. Consequently, new circuits and methods are needed which control pops without significantly impacting other aspects of system performance.

SUMMARY OF THE INVENTION

According to one embodiment of the inventive concepts circuitry is disclosed for ramping a voltage across a load. Charging circuitry charges a capacitor to generate a ramp-up wave form. Circuitry is also included for selectively decoupling a first driver from the load during a ramping up mode and coupling the first driver to the load during a normal operating mode. A ramp-up driver is selectively coupled to the load during the ramp-up mode which ramps up the voltage across load in response to the ramp-up wave form generated by the charging circuitry.

The principles of the present invention also provide for the ramping down of voltage across an output load. A capacitor is precharged to a selected voltage and a discharge circuit discharges the capacitor to generate a ramp-down wave form. Circuitry is also provided for selectively decoupling a first driver from output load during the ramping down of the voltage across output load. A ramp-down driver selectively ramps-down the voltage across output load in response to the ramp-down wave form generated by discharge circuit.

The inventive concepts allow for the control transients appearing to an output load during device power-up and power-down. These concepts are particularly useful in audio applications for eliminating or minimizing audible "pops" in an audio system, although not necessarily limited thereto.

BRIEF DESCRIPTION OF THE DRAWINGS

For a more complete understanding of the present invention, and the advantages thereof, reference is now made to the following descriptions taken in conjunction with the accompanying drawings, in which.

DESCRIPTION OF THE PREFERRED EMBODIMENTS

The principles of the present invention and their advantages are best understood by referring to the illustrated embodiment depicted in FIGS. 1–5 of the drawings, in which like numbers designate like parts.

Figure 1:
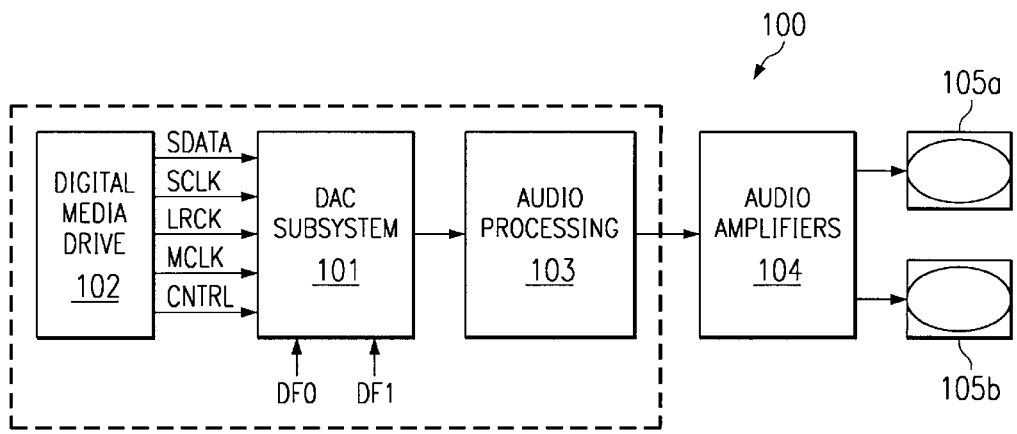
FIG. 1 is a diagram of a typical audio system. such as a portable compact disk player, according to the principles of the present invention.

FIG. 1 is a diagram of a typical audio system 100, such as a portable compact disk player, according to the principles of the present invention. A digital media drive 102 recovers the digital data, such as 1-bit or multi-bit encoded audio, from the storage media and passes those data, along with clocks and control signals, to DAC subsystem 101. The storage media could be a fixed media, such as a compact disk (CD) or a read/write memory such as RAM or Flash memory storing audio storing MPEG3 formatted audio. The resulting analog (audio) data undergoes further processing in circuit block 103 prior to amplification in amplifier block 104. Amplifier block 104 then drives a set of conventional speakers 105, a headset or the like. Audio processing circuits of block 103 and DAC can be integrated into a single integrated circuit or may comprise a plurality of integrated circuits. Additionally, in the case of an external speaker, this integrated circuit typically includes a line driver for driving the connection to the audio amplifiers, which also acts as an amplifier for directly driving a headset.

Figure 2A:
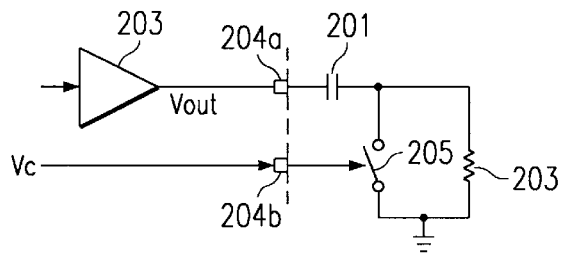
FIG. 2A illustrates a first possible technique for eliminating pops in the output.

FIG. 2A illustrates a first possible technique for eliminating pops in the output. Here, the external load is represented by a resistor 202 which is connected to the amplifier 203 by a coupling capacitor 201 driven from an on-chip amplifier (driver) 203 through a node 204a. An external shunt switch 205 is controlled by a control voltage Vc from the associated driving chip through a pad or pin 204b.

Figure 2B:
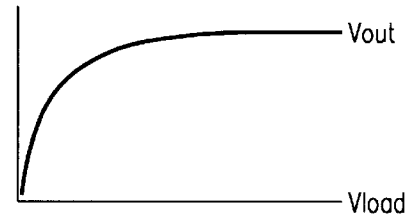
FIGS. 2B and 2C also illustrate the operation of the circuit of FIG. 2A.
Figure 2C:
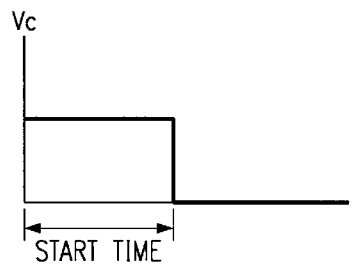

The operation of the circuit of FIG. 2A is illustrated in the diagrams of FIGS. 2B and 2C. During the power up, the control signal Vc closes shunt switch 205 while the output voltage Vout ramps up thereby shunting the output node to ground. After Vout has ramped-up approximately to its final value, the control signal Vc changes state to open switch 205. The system now operates normally. No transient voltage or current goes through load 202.

The disadvantages of the approach of FIG. 2A include the added expense of the external shunt switch as well as an extra control node and associated control circuitry.

Figure 3A:
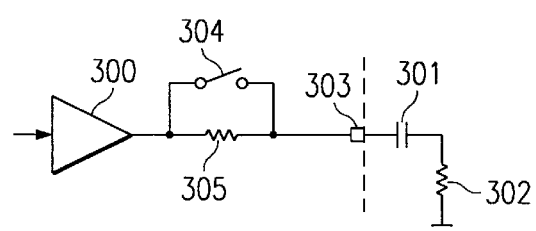
FIGS. 3A–3C illustrate a second approach in which output load modeled by capacitor and resistor are driven from the integrated circuit through a single node.
Figure 3B:
Figure 3C:
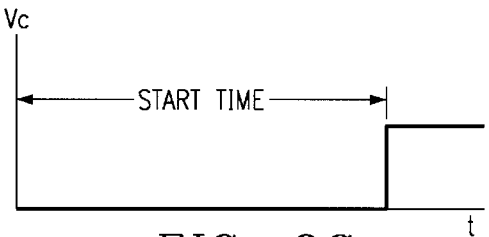

A second approach is illustrated in FIGS. 3A–3C. In this case, the output load modeled by resistor 302 which connects to an amplifier 300 by coupling capacitor 301, is driven from the integrated circuit through a single node 303. The on-chip amplifier 300 is coupled to the output pin through an on-chip resistor 304 and an internal shunt switch 305.

As generally depicted in FIGS. 3B and 3C, during the start up period internal shunt 305 is open (Vc, the voltage controlling internal shunt 305, is approximately zero volts). Consequently, the output voltage Vout slowly ramps up with the slow charge coupling of capacitor 301 through resistor 304. The voltage across the output load initially ramps-up and then ramps-down as capacitor 301 charges. The output transient signal power in the audio band is limited at the start of the charging cycle since the dv/dt is high in this region.

The primary disadvantage of the approach illustrated in FIG. 3A is the significant increase in the start up time caused by the slow RC charging.

Figure 4A:
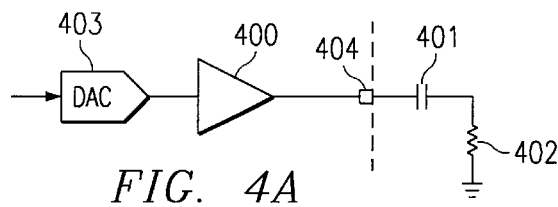
FIG. 4A depicts a digital pop guard.
Figure 4B:
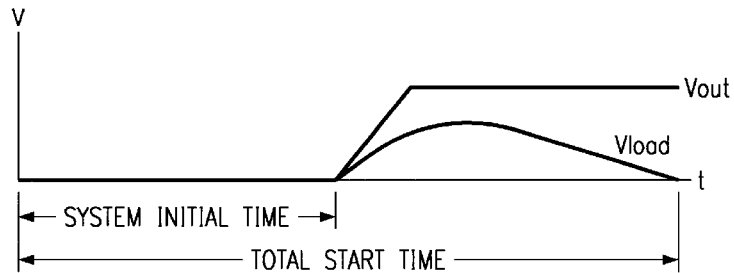
FIG. 4B illustrates a technique which requires a significant amount of time including a system initialization period to set up the DAC and the subsequent output voltage ramp-up period.

A digital pop guard is shown in FIG. 4A where the loads represented by a resistive element 402 and a coupling capacitive element 401. The input to the driving amplifier 402 is sourced by a digital to analog converter (DAC) 403 and drives the output load through node 404. DAC 403 ramps up the throughput of amplifier 400 slow enough to eliminate pops. As generally shown in FIG. 4B, this technique requires a significant amount of time including a system initialization period to set up the DAC and the subsequent output voltage ramp-up period. This technique is also only applicable to systems having one or more DACs available.

According to the principles of the present invention, independent control circuitry is used to perform a fast start up sequence. This independent circuitry charges the output nodes in a substantially linear ramp, after which the line driver or headphone amplifier takes over for normal system operation.

Figure 5A:
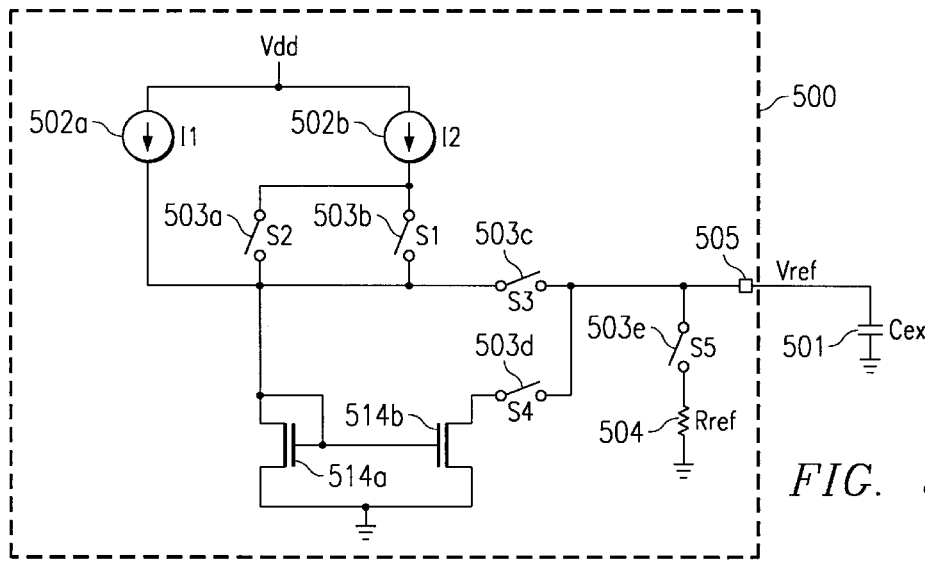
In FIG. 5A depicts charging circuitry charging an external capacitor from a pair of current sources through a node.
Figure 5B:
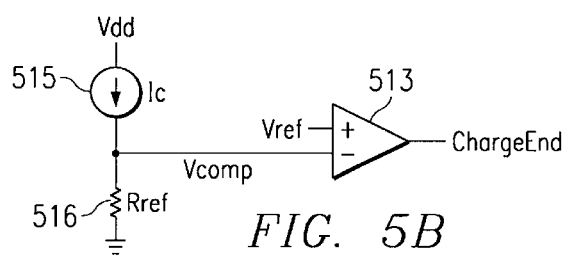
FIG. 5B depicts exemplary comparator circuitry for signaling the end of charging of the external capacitor.

In FIG. 5A, charging circuitry 500 charges an external capacitor 501 from a pair of current sources 502a,b through a node 505. The size of capacitor Cext is chosen as a function of the desired speed of the ramping (up or down). Charging and discharging capacitor Cext is controlled by a set of switches 503a,e, which have been labeled S1 to S5 for discussion purposes. A resistor 504 having a nominal resistance is used to maintain the voltage Vref at a predetermined level during normal operation.

Figure 5C:
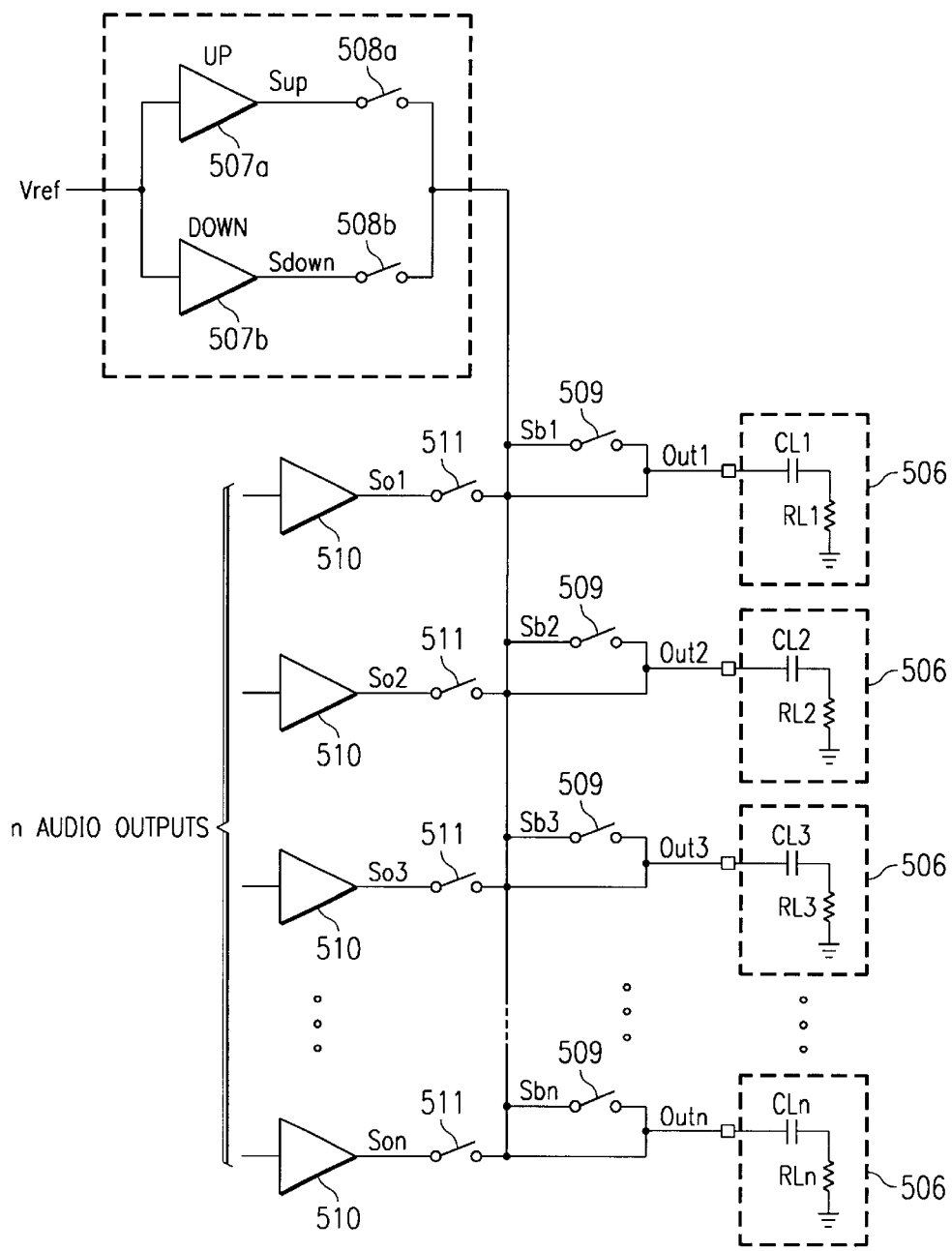
FIG. 5C depicts the output circuitry which drives n number of loads which may be speakers, a headset, or some combination thereof.

FIG. 5C depicts the output circuitry which drives n number of loads 506, which may be speakers, a headset, or some combination thereof. During the power ramp-up process, up driver 507a drives output loads 506 through switch 508a (Sup) and switches 509 (respectively labeled Sb1 to Sbn), During normal operation, line drivers/headset amplifiers 510 drive the loads through switches 511. Finally, during power ramp-down, down driver 507b is used through switch 508b (Sdown) and switches 509.

Figure 6A:
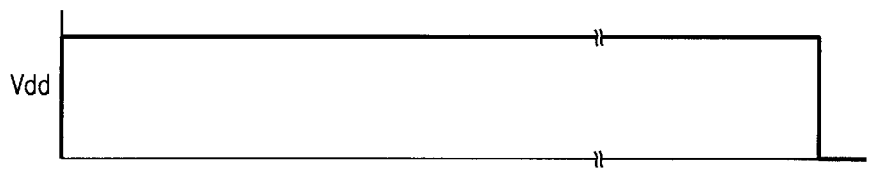
FIGS. 6A–6G are diagrams illustrating the operation of the circuitry of FIGS. 5A–5C during the ramp-up, normal operating and ramp-down modes.
Figure 6B:
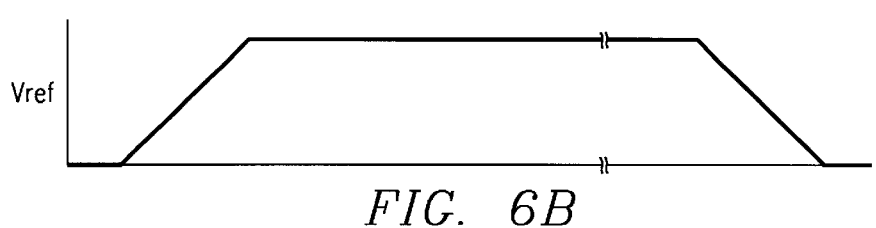
Figure 6C:
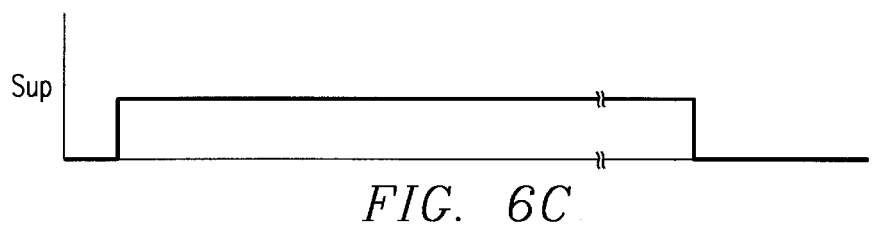
Figure 6D:
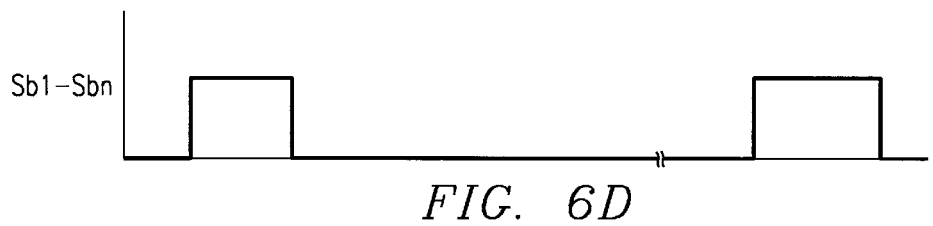
Figure 6E:
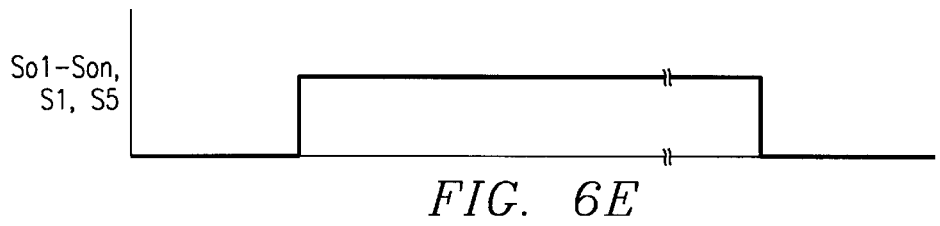
Figure 6F:
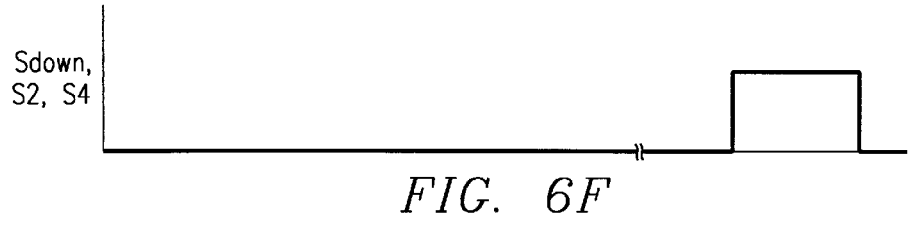
Figure 6G:
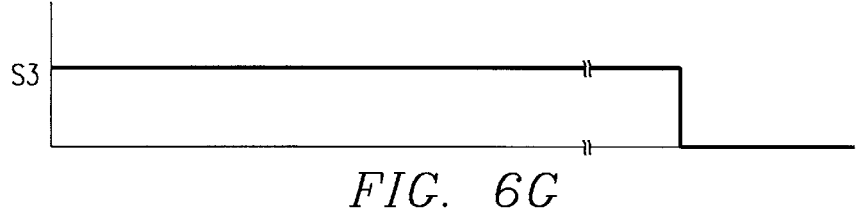

The operation of charging circuitry 500 and the associated output circuitry 500 can now be described, starting with the ramp-up process. All three phases (ramp-up, normal mode, ramp-down) are illustrated in FIGS. 6A–6G, where the high levels shown in FIGS. 6C–6D represent the closed state of the given switch controlled as by an active high control signal or switches, and the low levels represent the corresponding open states as controlled by an inactive low control signal.

During the ramp up phase, the power supply is switched on for a period of time to allow for the supply voltage Vdd to stabilize. Once this occurs, switches Sup and Sb1–Sbn are closed and switches S01–S0n are opened. In this configuration, output loads 506 will be driven by up driver 507a from the input voltage Vref generated in charging circuitry 500, Additionally, the output node 512 are enabled and switch Sdown is opened.

With respects to charging circuitry 500, switches S1, S2, S4 and S5 are initially open and switch S3 closed such that capacitor 501 begins to linearly charge from current source 502a. At the same time, as Vref begins to ramp and up driver 507a linearly ramps up the drive to output loads 506. The ramping process continues until Vref is roughly equal to a threshold Vcomp, at which point the signal ChargeEnd is generated by comparator circuitry 513 in FIG. 5B. (Here, Vcomp is selected by selecting a resistor 516 having resistance value Rref and a current source 515 having current value equal to the sum I1 and I2 or current sources 502a and 502b operating from the supply rail).

ChargeEnd transitions the output ramp-up process into a new phase.

Switches S1 and S5 are now closed to maintain the voltage Vref at approximately (I1+I2)/Rref. Additionally, switches Sb1–Sbn are opened and switches S01–S0n are closed. The device is now in the normal operating mode configuration, with the output loads 506 being driven by line drivers/headset amplifiers 510.

The preferred ramp down sequence is as follows. Line drivers/headset amplifiers 510 are disconnected from the output loads by opening switches So1–Son. Switches Sb1–Sbn are closed to switch control of the output loads to the Up and Down drivers 502a,b. Switch Sup is opened and switch Sdown is closed to select the Down driver 502b for driving the output loads.

In charging circuitry 500, switches S2 and S4 are closed and switches S1, S3 and S5 are opened. Load Transistors 514a and 514b turn on. External capacitor 501 then begins to discharge through transistor 502b such that Vref ramps down. In turn, Down driver 507b ramps down the voltage to output loads.

Once the transient currents end, the power supply, and the sourcing supply voltage Vdd, can be powered down.

In sum, the inventive concepts provide a means for the fast ramping-up and ramping-down of a voltage driving a load. In the illustrated embodiment, a capacitor is charged and discharged to generate a linear waveform. A set of independent buffers in response to this waveform ramp-up or ramp-down the voltage to the output load without pops. When the ramp-up is complete, the traditional line drivers/headset amplifiers assume control of the output. On ramp-down, the power supply voltage can be turned-off after the transient currents halt, thereby eliminating pops during the power-down process.

Although the invention has been described with reference to specific embodiments, these descriptions are not meant to be construed in a limiting sense. Various modifications of the disclosed embodiments, as well as alternative embodiments of the invention will become apparent to persons skilled in the art upon reference to the description of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

It is therefore, contemplated that the claims will cover any such modifications or embodiments that fall within the true scope of the invention.

What is claimed:

1. Circuitry for ramping a voltage across a load comprising:

a charging circuit for charging a capacitor to generate a ramp-up waveform;

circuitry for selectively decoupling a first driver from the load during a ramping-up mode and coupling said first driver to the load during a normal operating mode; and a ramp-up driver selectively coupled to said load during the ramp-up mode for ramping up the voltage across the load in response to the ramp-up waveform generated by said charging circuitry.

2. The circuitry of claim 1 wherein said charging circuitry comprises:

a switch for selectively coupling said capacitor with a current source during a charging phase of the ramp-up mode;

a comparator for comparing a reference voltage across said capacitor with a threshold voltage, said comparator circuitry generating an end of charge signal when said reference voltage and said threshold voltage are approximately equal; and switches for selectively coupling a second current source and a resistor to said capacitor in response to said end of charge signal to maintain the reference voltage a selected level.

3. The circuitry of claim 1 wherein said circuitry for selectively coupling and decoupling comprises a switch.

4. The circuitry of claim 1 wherein said ramp-up driver is selectively coupled to said load with a switch.

5. The circuitry of claim 1 wherein said first driver comprises a line driver.

6. The circuitry of claim 1 wherein said first driver comprises an amplifier for driving an audio headset.

7. Circuitry for ramping-down a voltage across an output load comprising:

a capacitor charges to a selected voltage;

a discharge circuit for discharging said capacitor to generate a ramp down waveform;

circuitry for selectively decoupling a first driver from said output load during ramping-down of voltage across said output load; and a ramp-down driver for selectively ramping-down said voltage across said output load in response to the ramp down waveform generated by said discharge circuit.

8. The circuitry of claim 7 wherein said discharge circuitry comprises a switch for selectively coupling said capacitor with a discharge load.

9. The circuitry of claim 8 wherein said discharge load comprises a transistor.

10. The circuitry of claim 7 wherein said circuitry for decoupling the first driver from the output load comprises a switch.

11. The circuitry of claim 7 wherein said ramp-down driver is selectively coupled to said output load with a switch.

12. The circuitry of claim 7 wherein said first driver comprises a line driver.

13. The circuitry of claim 7 wherein said first driver comprises an amplifier for driving an audio headset.

* * * * *